(12) United States Patent
Ruby

(10) Patent No.: US 9,762,205 B2
(45) Date of Patent: *Sep. 12, 2017

(54) TEMPERATURE CONTROLLED ACOUSTIC RESONATOR

(71) Applicant: Avago Technologies General IP (Singapore) Pte. Ltd., Singapore (SG)

(72) Inventor: Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/843,959

(22) Filed: Sep. 2, 2015

(65) Prior Publication Data

US 2015/0381141 A1    Dec. 31, 2015

Related U.S. Application Data

(63) Continuation of application No. 13/361,724, filed on Jan. 30, 2012, now Pat. No. 9,154,103.

(51) Int. Cl.
| | |
|---|---|
| *H03H 9/17* | (2006.01) |
| *H03H 9/54* | (2006.01) |
| *H03H 9/02* | (2006.01) |
| *H03H 9/08* | (2006.01) |
| *H03H 3/02* | (2006.01) |

(52) U.S. Cl.
CPC .............. *H03H 9/172* (2013.01); *H03H 3/02* (2013.01); *H03H 9/02102* (2013.01); *H03H 9/08* (2013.01); *H03H 9/54* (2013.01)

(58) Field of Classification Search
CPC ............. H03H 9/172; H03H 9/08; H03H 3/02

USPC .......................................................... 333/188
See application file for complete search history.

(56) References Cited

U.S. PATENT DOCUMENTS

| | | | |
|---|---|---|---|
| 3,601,639 | A | 8/1971 | Hannon |
| 5,165,289 | A | 11/1992 | Tilmans |
| 5,260,596 | A | 11/1993 | Dunn et al. |
| 5,587,620 | A | 12/1996 | Ruby et al. |
| 5,780,713 | A * | 7/1998 | Ruby ................ C23C 16/08 29/25.35 |
| 5,873,153 | A | 2/1999 | Ruby et al. |
| 5,910,756 | A | 6/1999 | Ella |
| 5,917,272 | A | 6/1999 | Clark et al. |
| 5,977,840 | A | 11/1999 | Connell et al. |
| 6,060,818 | A | 5/2000 | Ruby et al. |

(Continued)

OTHER PUBLICATIONS

Sankaragomathi, et al., "A ±3ppm 1.1mW FBAR Frequency Reference with 750MHz Output and 750mV Supply", 2015 IEEE International Solid-State Circuits Conference, p. 454-456.

(Continued)

*Primary Examiner* — Stephen E Jones
*Assistant Examiner* — Scott S Outten

(57) ABSTRACT

An acoustic resonator device includes an annular acoustic resonator, a heater coil and a heat sensor. The annular acoustic resonator is positioned over a trench formed in a substrate of the acoustic resonator device. The heater coil is disposed around a perimeter of the annular acoustic resonator, the heater coil including a resistor configured to receive a heater current. The heat sensor is configured to adjust the heater current in response to a temperature of the heater coil.

18 Claims, 13 Drawing Sheets

(56) References Cited

U.S. PATENT DOCUMENTS

| | | |
|---|---|---|
| 6,107,721 A | 8/2000 | Lakin |
| 6,111,338 A | 8/2000 | Otsuchi et al. |
| 6,228,675 B1 | 5/2001 | Ruby et al. |
| 6,262,637 B1 | 7/2001 | Bradley et al. |
| 6,265,246 B1 | 7/2001 | Ruby et al. |
| 6,384,697 B1 | 5/2002 | Ruby |
| 6,429,511 B2 | 8/2002 | Ruby et al. |
| 6,507,983 B1 | 1/2003 | Ruby et al. |
| 6,635,519 B2 | 10/2003 | Barber et al. |
| 6,707,351 B2 * | 3/2004 | Gorrell ............... H03H 3/0077 257/414 |
| 6,762,471 B2 | 7/2004 | Kim |
| 6,787,897 B2 | 9/2004 | Geefay et al. |
| 6,828,713 B2 | 12/2004 | Bradley et al. |
| 6,919,222 B2 | 7/2005 | Geefay |
| 6,979,597 B2 | 12/2005 | Geefay et al. |
| 6,984,925 B2 | 1/2006 | Morley et al. |
| 7,161,283 B1 | 1/2007 | Geefay |
| 7,268,647 B2 | 9/2007 | Sano et al. |
| 7,275,292 B2 | 10/2007 | Ruby et al. |
| 7,280,007 B2 | 10/2007 | Feng et al. |
| 7,298,067 B1 | 11/2007 | Kosinski |
| 7,312,675 B2 | 12/2007 | Ruby |
| 7,345,410 B2 | 3/2008 | Grannen et al. |
| 7,388,454 B2 | 6/2008 | Ruby et al. |
| 7,545,237 B2 | 6/2009 | Hagelin et al. |
| 7,563,475 B2 | 7/2009 | Ruby et al. |
| 7,576,471 B1 | 8/2009 | Solal |
| 7,619,493 B2 | 11/2009 | Uno et al. |
| 7,623,007 B2 | 11/2009 | Nakatsuka et al. |
| 7,629,865 B2 | 12/2009 | Ruby |
| 7,714,684 B2 | 5/2010 | Ruby et al. |
| 7,791,434 B2 | 9/2010 | Fazzio et al. |
| 7,795,781 B2 | 9/2010 | Barber et al. |
| 7,889,024 B2 | 2/2011 | Bradley et al. |
| 7,984,536 B2 | 7/2011 | Takahashi |
| 7,986,075 B2 | 7/2011 | Asai et al. |
| 8,188,810 B2 | 5/2012 | Fazzio et al. |
| 8,232,845 B2 | 7/2012 | Ruby |
| 8,248,185 B2 | 8/2012 | Choy et al. |
| 8,922,302 B2 | 12/2014 | Ruby |
| 9,069,005 B2 | 6/2015 | Ruby |
| 9,246,461 B2 | 1/2016 | Akiyama et al. |
| 2005/0012571 A1 | 1/2005 | Song et al. |
| 2005/0028336 A1 | 2/2005 | Robert et al. |
| 2005/0269904 A1 | 12/2005 | Oka |
| 2006/0071736 A1 | 4/2006 | Ruby et al. |
| 2007/0035214 A1 | 2/2007 | Kasahara |
| 2007/0205850 A1 | 9/2007 | Jamneala et al. |
| 2007/0262831 A1 * | 11/2007 | Van Beek .......... H03H 9/02448 333/186 |
| 2008/0111651 A1 | 5/2008 | Isobe et al. |
| 2008/0283944 A1 | 11/2008 | Geefay |
| 2008/0284544 A1 | 11/2008 | Hashimura |
| 2009/0014653 A1 | 1/2009 | Parrish |
| 2009/0127978 A1 * | 5/2009 | Asai ..................... H03H 3/02 310/322 |
| 2010/0176899 A1 | 7/2010 | Schaufele et al. |
| 2010/0187948 A1 | 7/2010 | Sinha et al. |
| 2010/0315179 A1 | 12/2010 | Schoepf et al. |
| 2010/0327697 A1 | 12/2010 | Choy et al. |
| 2010/0327994 A1 | 12/2010 | Choy et al. |
| 2011/0180391 A1 | 7/2011 | Larson, III et al. |
| 2012/0177816 A1 | 7/2012 | Larson, III et al. |
| 2012/0326807 A1 | 12/2012 | Choy et al. |
| 2013/0049888 A1 | 2/2013 | Ruby |
| 2013/0194057 A1 | 8/2013 | Ruby |
| 2014/0118090 A1 | 5/2014 | Grannen et al. |
| 2014/0132117 A1 | 5/2014 | Larson et al. |
| 2014/0232244 A1 | 8/2014 | Sridaran et al. |
| 2014/0354109 A1 | 12/2014 | Grannen et al. |
| 2015/0244346 A1 | 8/2015 | Feng et al. |
| 2015/0244347 A1 | 8/2015 | Feng et al. |

OTHER PUBLICATIONS

Jha, et al., "Thermal Isolation of Encapsulated MEMS Resonators", Journal of Microelectromechanical Systems, vol. 17, No. 1, Feb. 2008, 175-184.

Ruby, "Micronnachined Cellular Filters", Hewlett-Packard Laboratories, Hewlett-Packard, Palo Alto, CA 94304, 1996 IEEE MTT-S Digest, 1149-1152.

Vig, "Introduction to Quartz Frequency Standards", Research and Development Technical Report SLCET-TR-92-1 (Rev. 1), Distribution Statement, Army Research Laboratory, Electronics and Power Sources Directorate, Fort Monmouth, NY 07703-5601, U.S. A., Oct. 1992, 56 pages.

Unkrich, FBAR Resonator Mechanical Stress Relief, IP.com No. IPCOM000214956D, IP.com Electronic Publication, Feb. 15, 2012.

Office Action dated Oct. 3, 2016 in co-pending U.S. Appl. No. 14/262,737.

* cited by examiner

TEMPERATURE CONTROLLED ACOUSTIC RESONATOR

CROSS-REFERENCE TO RELATED APPLICATIONS

This application is a continuation under 37 C.F.R. §1.53(b) of U.S. patent application Ser. No. 13/361,724 filed on Jan. 30, 2012. Priority is claimed under 35 U.S.C. §120 from U.S. Patent Application U.S. patent application Ser. No. 13/361,724. The entire disclosure of U.S. patent application Ser. No. 13/361,724 is specifically incorporated herein by reference.

BACKGROUND

Acoustic resonators are used to filter electrical signals in various electronic applications. For example, acoustic resonators are used as bandpass filters in cellular phones, global positioning system (GPS) devices, and imaging applications, to name but a few.

An acoustic resonator can be characterized generally by a center frequency and bandwidth. However, due to a variety of intrinsic and extrinsic influences, the center frequency and bandwidth can drift over time, which may be referred to as frequency drift, or more generally "aging." One cause of aging in acoustic resonators is physical stress, specifically a differential stress. A differential stress refers to the membrane being forced to bow, buckle or be stretched (like a Kettle Drum) in response to differential forces applied to the different edges of the resonator. The source of this differential stress, that is the physical stress, can be caused, for example, by forces transmitted to the acoustic resonator through adjacent components.

Notably, the acoustic resonator is inside a small package; typically a chip-scale package. In many cases, the chip-scale package may be an all-silicon MEMs like package. As an example, an acoustic resonator (in an all-silicon package) can be mounted on a printed circuit board (PCB) comprising metal and laminate components. As the PCB is heated or cooled, the PCB may expand or contract unevenly because the metal and laminate components have different temperature coefficients of expansion. This uneven expansion or contraction can cause the PCB to change shape in a "potato chip" fashion. As the PCB changes shape, the PCB will transfer forces to the acoustic resonator through various intervening components, such as an epoxy bonding material, or the silicon package containing the acoustic resonator. As these forces are transferred to the acoustic resonator, they will change the center frequency of the acoustic resonator. Although the frequency change is relatively small, it is significant in terms of other sources of aging such as the electrode metal relaxation effect associated with quartz crystal aging.

FIG. 1A is a diagram illustrating an acoustic resonator inside of an all-silicon, chip-scale package mounted on a PCB using a standard epoxy, and FIG. 1B is a diagram illustrating forces applied to the acoustic resonator. For example, it may be assumed that acoustic resonator 115 is located inside a chip-scale package 100 mounted on a PCB 101. Forces are applied to the chip-scale package 100 from the PCB 101, and from the chip-scale package 100 to acoustic resonator structure as indicated by arrows in FIG. 1B. The forces shown in FIG. 1B can originate from various sources. For example, forces can originate from the PCB 101 when it has been warped in response to temperature changes, as described above. Alternatively, forces could originate from the PCB 101 that has been bent when clamped to a chassis or another motherboard, or from the soldering of the chip-scale package 100 package onto the PCB 101.

More particularly, referring to FIGS. 1A and 1B, the chip-scale package 100 comprises a silicon substrate 105 with an acoustic resonator mounted inside (which may be a film bulk acoustic resonator (FBAR) or a contour mode acoustic resonator, or a Rayliegh-Lamb mode type resonator, for example) and a silicon lid (or microcap structure) 106. The lid 106 is attached to the substrate 105 by a sealant or gasket 123, for example. An air gap 110 is formed between substrate 105 and acoustic resonator 115 so that acoustic resonator 115 can resonate freely.

Curved lines 120 represent the interface of the mounted resonator shown with other structures, such as the PCB 101, the chip-scale packaging, etc. Forces created by, or presented to these structures can be present. These forces can be transferred from the package to substrate 105 through various intervening features, such as an epoxy bonding 122 or lid 106. The transferred forces create stresses 125 on substrate 105. Stresses 125 propagate through substrate 105 and other features to create stresses 130 where acoustic resonator 115 is connected to substrate 105. Stresses 130 exert torque on acoustic resonator 115, which can change the center frequency on the acoustic resonator 115.

FIG. 1C is a diagram illustrating a simulation of forces transferred from substrate 105 to acoustic resonator 115. As illustrated in FIG. 1C, the forces on substrate 105 cause stress at an edge of acoustic resonator 115. The stress is transmitted horizontally through acoustic resonator 115, which can affect the resonance of the acoustic resonator 115, as explained above.

FIG. 2A is a graph illustrating changes of the center frequency of a conventional acoustic resonator structure as a function of temperature, where the device temperature is swept from about 20° C. to about 130° C. several times. The parabolic nature of the frequency dependence on temperature is an intrinsic property of a so-called zero drift resonator (ZDR). However, the apparent hysteresis—or shift from one temperature run to the next—is due to the externally applied stresses. The graph of FIG. 2A was generated with the ZDR mounted on a PCB in laboratory conditions. A resonator under real-life conditions may experience even more frequency "hysteresis" than that illustrated in FIG. 2A.

Referring to FIG. 2A, the ZDR was heated from an initial temperature of approximately 70° C. to a temperature of approximately 130° C. The resonator was then cooled to approximately 25° C. and heated back to approximately 70° C. The center frequency of the acoustic resonator changed by approximately −50 ppm when the temperature was raised from 70° C. to 130° C. Then, as the temperature was cooled back to 70° C., the center frequency passed through a point at 0 ppm, which is offset from the original center frequency by approximately 20 ppm. As illustrated by the different center frequencies exhibited at 70° C., the center frequency of the acoustic resonator exhibits both temperature dependence as well as temperature based hysteresis. The parabolic temperature dependence is a property of the stiffness of the materials present in the acoustic stack of the ZDR and can be compensated elsewhere in the circuit. But, the hysteresis is created by variations in applied forces to the substrate. One cause for the change in force is that the epoxy (a hydrophilic material) outgases moisture and as the epoxy becomes more desiccated, it shrinks and thus applies a different force to the mounted ZDR. The use of softer epoxies helps mitigate, but not eliminate, the transfer of stress from the PCB to the acoustic resonator.

Not shown, but we have measured, is that when one also does injection molding to cover the die (as typical of today's ASIC chips in QFN packages), the transfer of stress is magnified and, if the customer does the injection molding, there is no hope of controlling the amount of offset in frequency created by the applied physical stresses.

The frequency changes shown in FIG. 2A will be too large for many high accuracy electronic applications. For example, GPS devices can only tolerate aging-related frequency changes on the order of +/−0.5 ppm. Similarly, wireless applications, such as low power radios used in WiFi or Bluetooth can only tolerate aging-related frequency changes on the order of +/−10 ppm.

Acoustic resonators have an associated turnover temperature (TOT), which is the temperature at which the center frequency does not change with temperature. FIG. 2B is a graph illustrating TOT curves for two different acoustic resonators, one having an AlN piezoelectric layer with a thickness of 29,530 Å and electrodes with a thickness of 2,800 Å (solid line), and another having an AlN piezoelectric layer with a thickness of 29,100 Å and electrodes with a thickness of 2,900 Å (dotted line). At TOT, changes in frequency versus changes in temperature are quite small. Therefore, when the temperature of the acoustic resonator is kept close to the TOT (e.g., within about 1° C.), then changes in frequency of the acoustic resonator due to any (ambient) temperature variations will be very small. For example, at TOT, the second order coefficient of temperature $\beta$ of a typical ZDR stack is −20 ppb/$C^2$. Thus, even a maximum 1° C. temperature excursion would incur only a 0.02 ppm frequency shift. In comparison, the second order coefficient of temperature $\beta$ of a ZDR stack according to representative embodiments is only −10 ppb/$C^2$. This means that if the temperature (or the TOT) is off by +/−10° C., the error in stability is only +/−1 ppm.

What is needed, therefore, are techniques for reducing frequency drift due to physical stresses in acoustic resonator structures, including changes in temperature.

SUMMARY

According to a representative embodiment, an acoustic resonator device includes an acoustic resonator, a heater coil and a heat sensor. The acoustic resonator is positioned over a trench formed in a substrate. The heater coil is disposed around a perimeter of the acoustic resonator, the heater coil comprising a resistor configured to receive a heater current. The heat sensor is configured to adjust the heater current in response to a temperature of the heater coil.

According to another representative embodiment, an acoustic resonator device includes a substrate incorporating a trench, an acoustic resonator suspended over the trench, a heater coil, a heat sensor and multiple tethers. The acoustic resonator comprises a first electrode, a piezoelectric layer stacked on the first electrode and a second electrode stacked on the piezoelectric layer, a portion of the piezoelectric layer extending beyond an outer edge the first electrode. The heater coil is disposed around an outer perimeter of the acoustic resonator on a first surface of the extended portion of the piezoelectric layer. The heat sensor is disposed around the outer perimeter of the acoustic resonator on a second surface of the extended portion of the piezoelectric layer, opposite the first surface. The tethers are connected to the outer perimeter of the acoustic resonator and configured to suspend the acoustic resonator over the trench. A first tether comprises a first conductive trace for providing heater current to the heater coil and a second tether comprises a second conductive trace for providing heat sensor current to the heat sensor. The heat sensor is configured to adjust the heater current based on a temperature of the heater coil.

According to another representative embodiment, an acoustic resonator device includes a substrate incorporating a trench, an annular acoustic resonator suspended over the trench, a heater coil, a heat sensor and flexible tethers. The heater coil is disposed around an outer perimeter of the annular acoustic resonator on a bottom surface of the annular acoustic resonator, and configured to provide resistive heat in response to a heater current. The heat sensor is disposed around the outer perimeter of the annular acoustic resonator on a top surface of the annular acoustic resonator, and configured to adjust the heater current in response to a temperature of the heater coil. The flexible tethers are configured to suspend the annular acoustic resonator over the trench. A first tether of the flexible tethers comprises a first membrane, a first conductive trace formed on a bottom surface of the first membrane providing a supply path for the heater current, and a second conductive trace formed on a top surface of the membrane providing a return path for the heater current.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION OF EMBODIMENTS

Figure 1A:
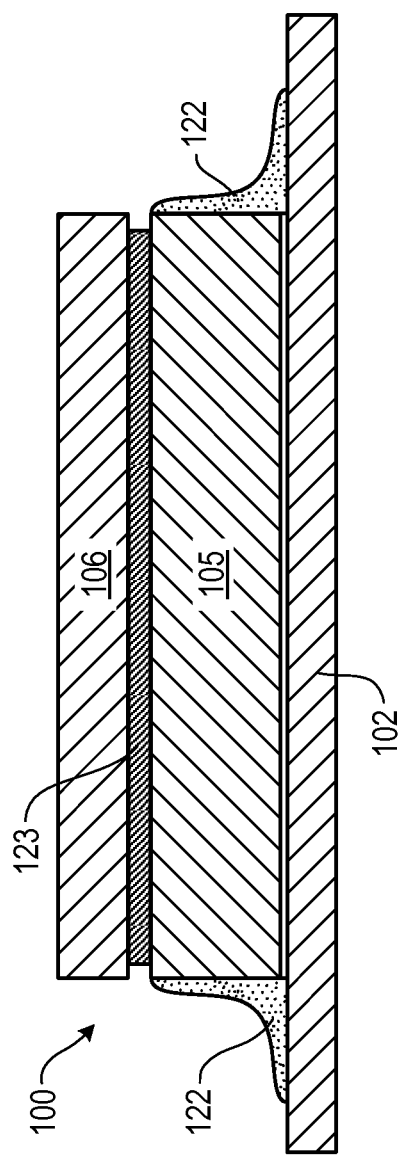
FIG. 1A is a diagram illustrating an acoustic resonator inside of an all-silicon, chip-scale package mounted on a PCB.
Figure 1B:
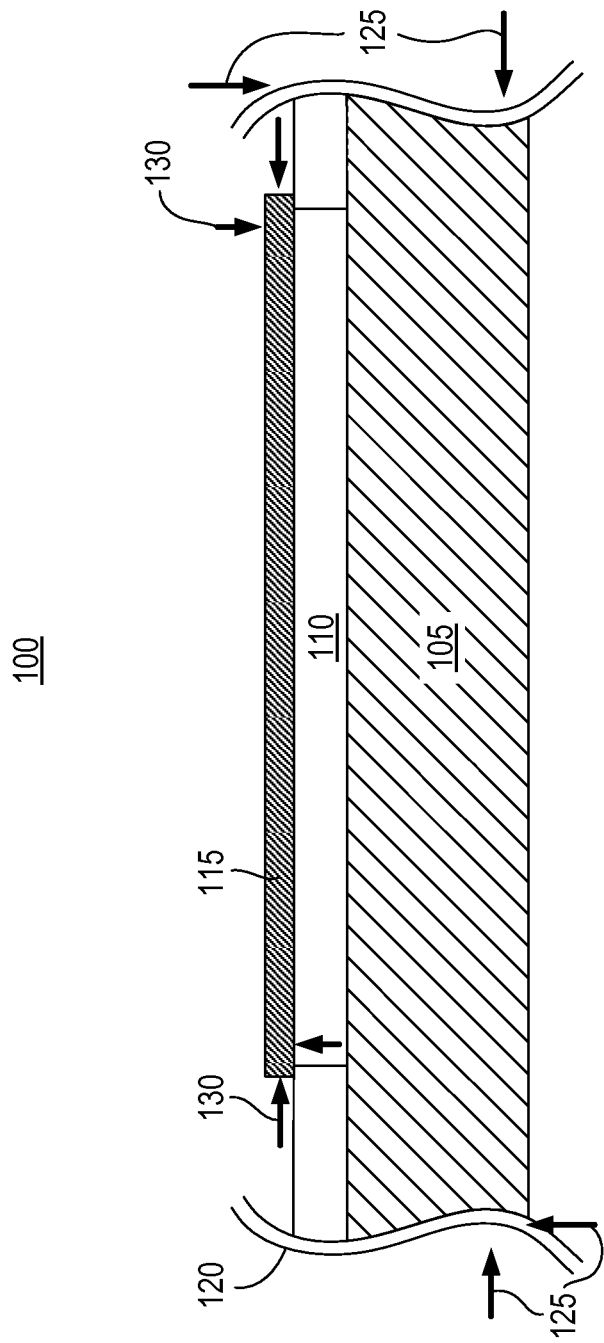
FIG. 1B is a diagram illustrating forces applied to a known acoustic resonator structure.
Figure 1C:
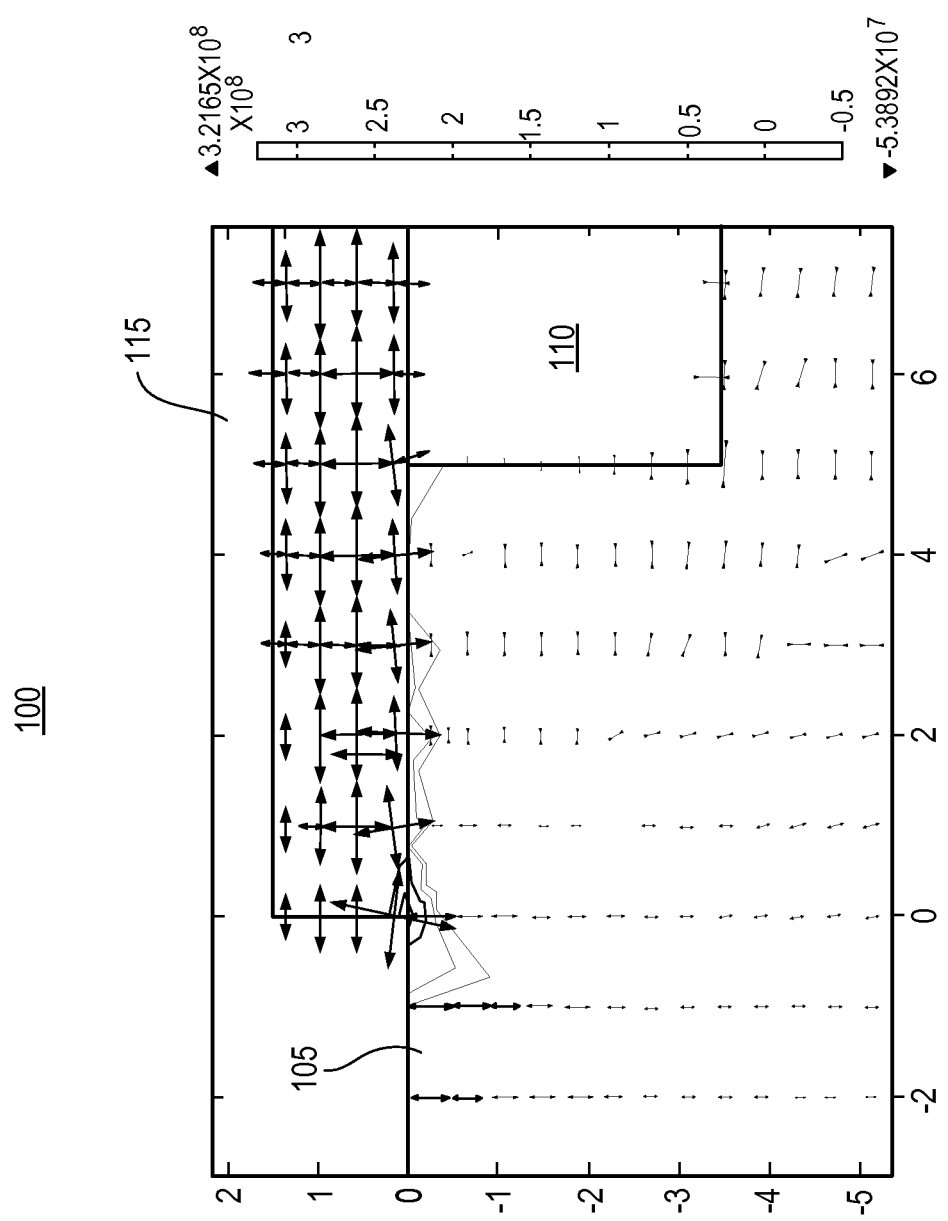
FIG. 1C is a diagram illustrating a simulation of forces transferred from a substrate to an FBAR in the acoustic resonator structure of FIG. 1B.
Figure 2A:
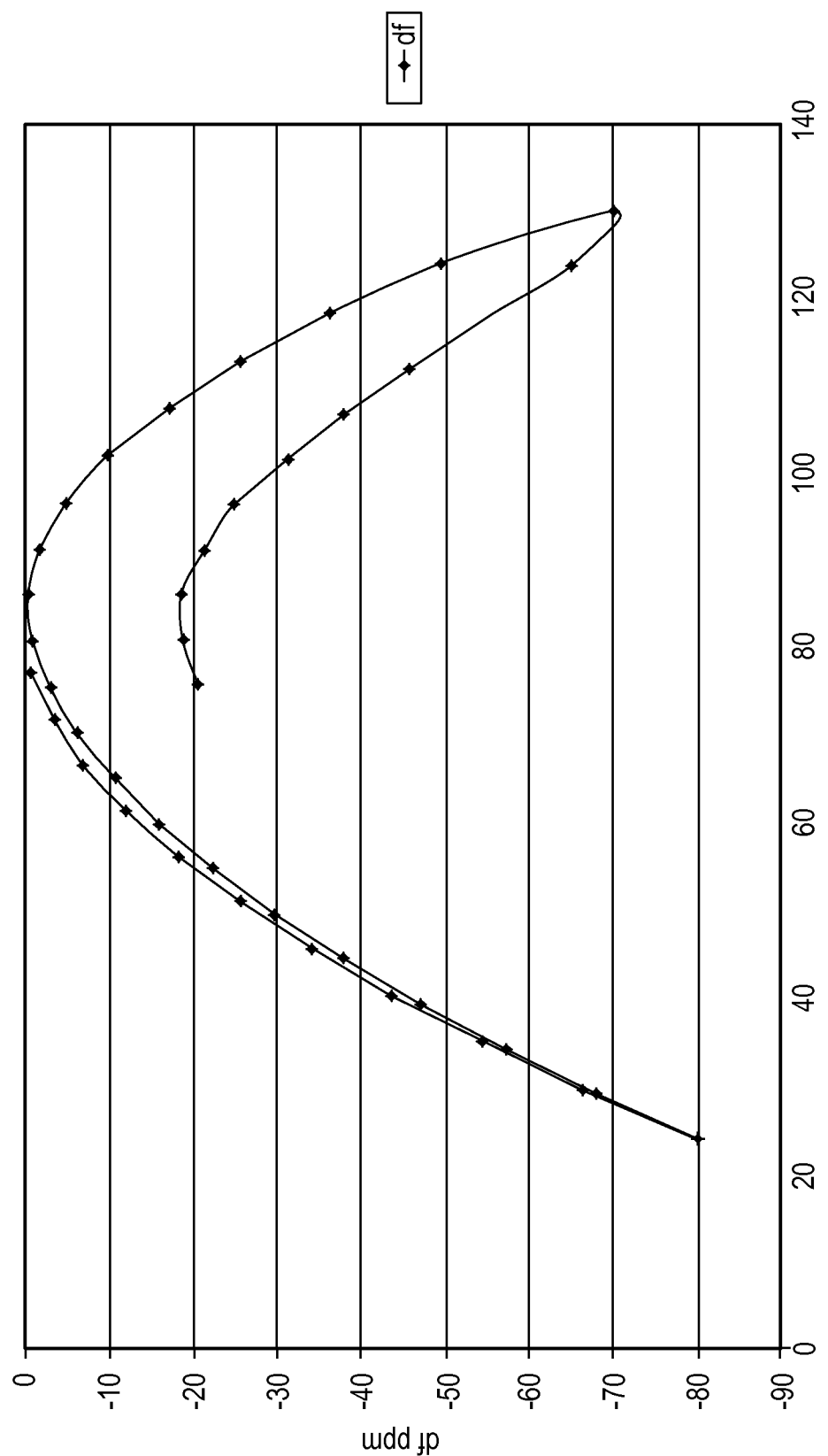
FIG. 2A is a graph illustrating changes of the center frequency of a conventional acoustic resonator structure as a function of temperature.
Figure 2B:
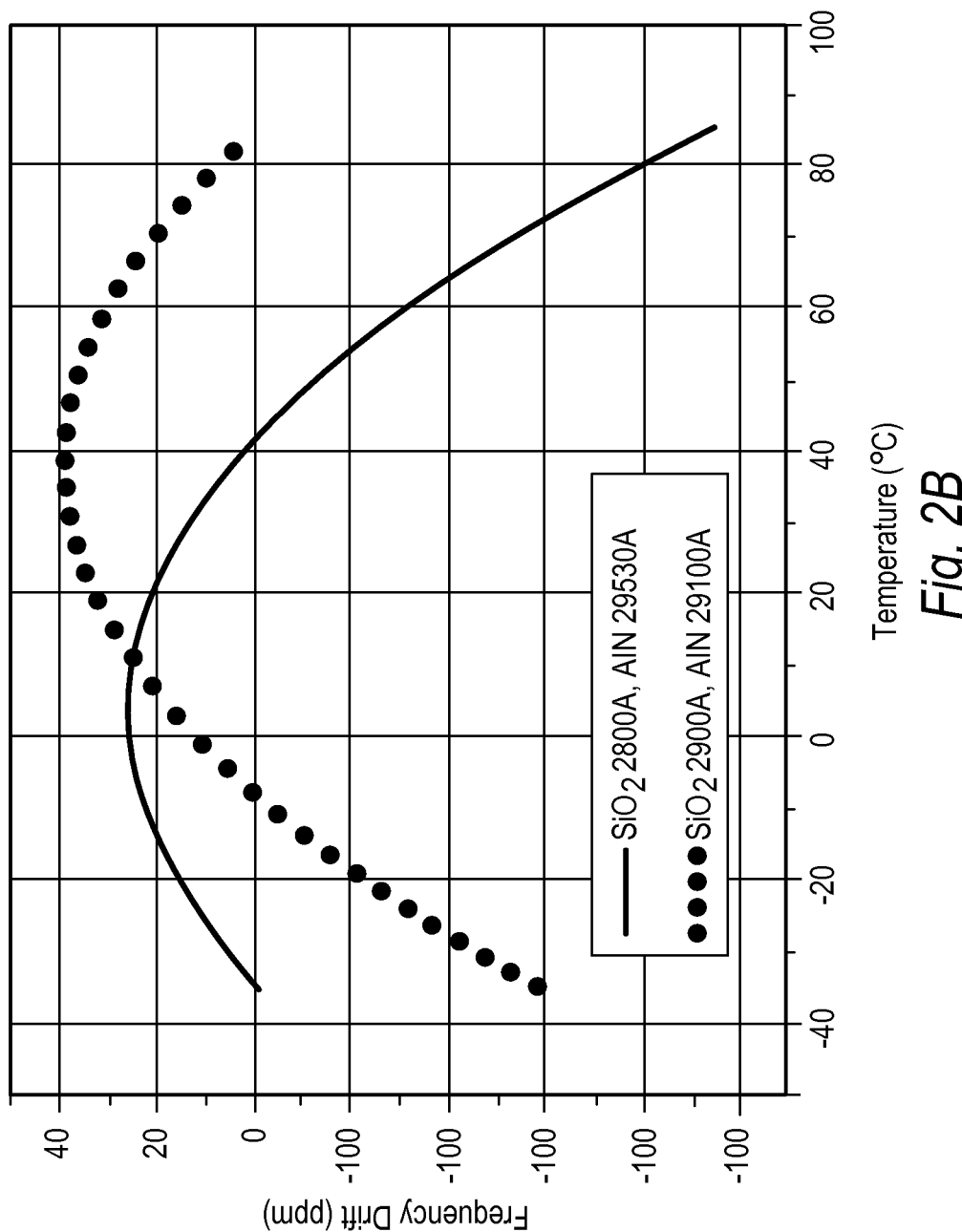
FIG. 2B is a graph illustrating turn over temperature (TOT) curves for two acoustic resonators.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion. For example, the terms "isolation" or "separation" are not to be interpreted to require a complete lack of interaction between the described features.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings relate generally to bulk acoustic wave (BAW) resonator structures. These resonator structures can include various types of acoustic resonators, such as, for example, FBARs, ZDRs, double bulk acoustic resonators (DBARs), and coupled resonator filters (CRFs). In certain embodiments, the BAW resonator structures can be used to provide electrical filters (e.g., ladder filters). In addition, in certain embodiments one or more acoustic resonators can be coupled to a circuit in an "FMOS" configuration, for example as described in commonly owned U.S. patent applications: Ser. No. 12/891,039, entitled "Packaged Device with Acoustic Resonator and Electronic Circuitry and Method of Making the Same" filed on Sep. 27, 2010, to Ruby, et al.; Ser. No. 13/162,883 entitled "Capacitance Detector for Accelerometer and Gyroscope and Accelerometer and Gyroscope with Capacitance Detector" filed on Jun. 17, 2011, to Ruby, et al.; and Ser. No. 13/216,633 entitled "Acoustic Resonator Formed on a Pedestal" filed on Aug. 24, 2011, to Ruby, et al. The foregoing patent applications are hereby incorporated by reference as if set forth herein.

Certain details of BAW resonators, BAW resonator filters, related materials, and methods of fabrication may be found in one or more of the following commonly owned U.S. Patents and Patent Application Publications: U.S. Pat. No. 6,107,721, to Lakin; U.S. Pat. Nos. 5,587,620, 5,873,153, 6,060,818 and 6,507,983 to Ruby, et al.; U.S. Pat. No. 7,629,865 to Ruby, et al.; U.S. Pat. No. 7,280,007 to Feng, et al.; U.S. Patent Application Publication No. 20070205850 to Jamneala, et al.; U.S. Patent Application Publication No. 20060071736 to Ruby, et al; U.S. Patent Application Publication No. 20100327697 to Choy, et al.; and U.S. Patent Application Publication No. 20100327994 to Choy, et al. Examples of stacked bulk acoustic resonators, as well as their materials and methods of fabrication, may be found in U.S. Pat. No. 7,889,024 to Bradley et al. The foregoing patents and patent applications are hereby incorporated by reference as if set forth herein. It is emphasized that the components, materials and method of fabrication described in these patents and patent applications are representative and other methods of fabrication and materials within the purview of one of ordinary skill in the art are contemplated.

Certain embodiments described below relate to an acoustic resonator structure having an integrated heater and temperature feedback circuit for maintaining a substantially constant temperature of the acoustic resonator. Certain embodiments described below relate to an acoustic resonator structure comprising an acoustic resonator formed on a pedestal. The pedestal supports the acoustic resonator such that forces transmitted to the pedestal produce minimal physical stress on the acoustic resonator. In other words, the pedestal mechanically isolates the acoustic resonator to prevent the acoustic resonator from being influenced by surrounding forces. Any forces applied to the base of the pedestal cannot and will not be transferred to the resonator. Specifically, no differential forces are applied. In this manner, the pedestal eliminates the amount of frequency drift in the acoustic resonator due to physical stress. Certain embodiments described below relate to an acoustic resonator structure comprising tethers configured to connect to the acoustic resonator, e.g., suspending the acoustic resonator over a trench. When the acoustic resonator structure has an annular shape, the integrated heater may be formed around an outer perimeter and/or an inner perimeter of the acoustic resonator structure. Heater current may be provided to the heater via conductors in one or more of the tethers.

Certain embodiments described below can be used in electronic applications such as low power radios for wireless applications, GPS devices, and imaging devices, to name but a few. Some embodiments are particularly relevant to high accuracy devices requiring filters with minimal frequency drift. For example, some embodiments can be used to displace existing technologies such as existing Quartz based oscillators used in GPS devices. In addition, some embodiments also provide thermal isolation by forming the pedestal of a material having low thermal conductivity, which can allow the resonators to be used in thermally dynamic environments.

Figure 3:
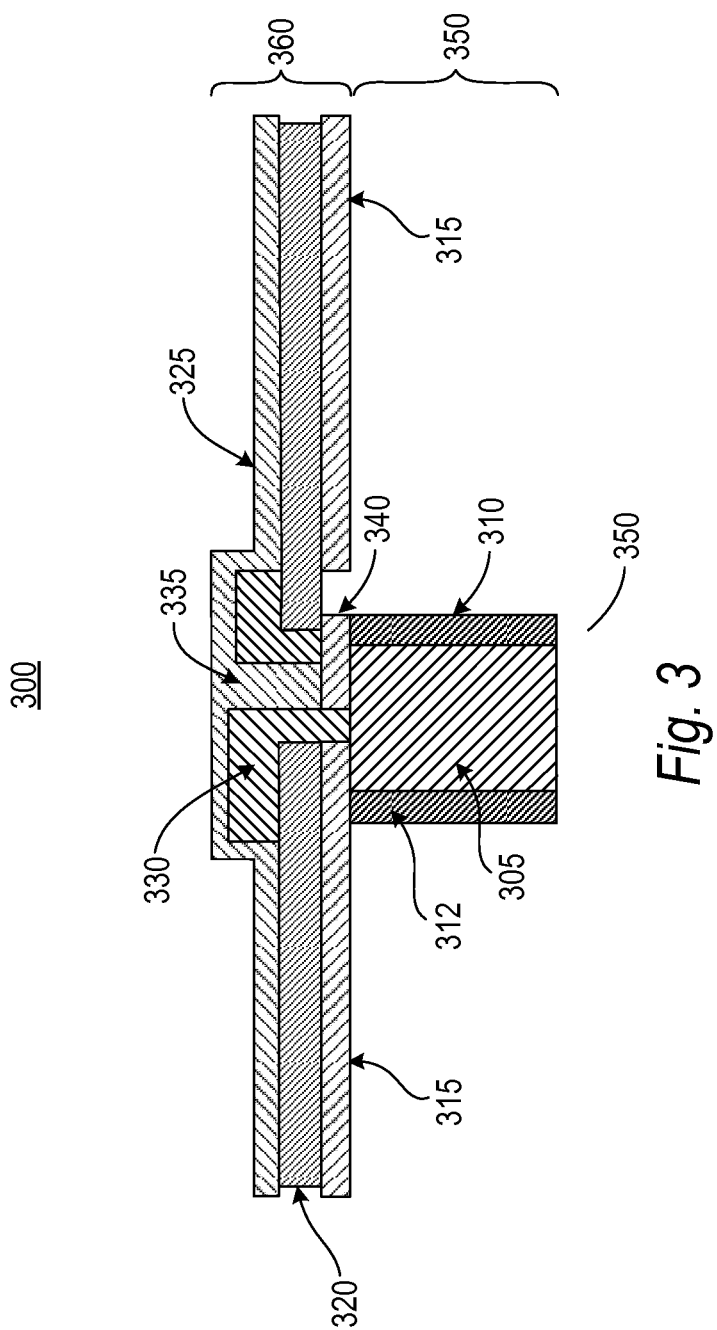
FIG. 3 is a diagram illustrating an acoustic resonator structure according to a representative embodiment.

FIG. 3 is a diagram illustrating an acoustic resonator structure 300 according to a representative embodiment.

Referring to FIG. 3, acoustic resonator structure 300 comprises a pedestal 350, and an acoustic resonator 360 attached to pedestal 350 at a central location. Acoustic resonator 360 is formed in an annular shape around pedestal 350.

Pedestal 350 comprises a pillar 305, a first contact 310 and a second contact 312. First and second contacts 310 and 312 make up a set of conductive traces formed of an electrically conductive material, such as tungsten, molybdenum and/or ruthenium. First and second contacts 310, 312 are electrically isolated from each other so that first contact 310 forms a first conductive path connected to acoustic resonator 360, and second contact 312 forms a second conductive path connected to acoustic resonator 360. One of the first and second contacts 310 and 312 is a positive RF (or "hot") connection, and the other one of the first and second contacts 310 and 312 is a negative RF (or "ground") connection.

Figure 4:
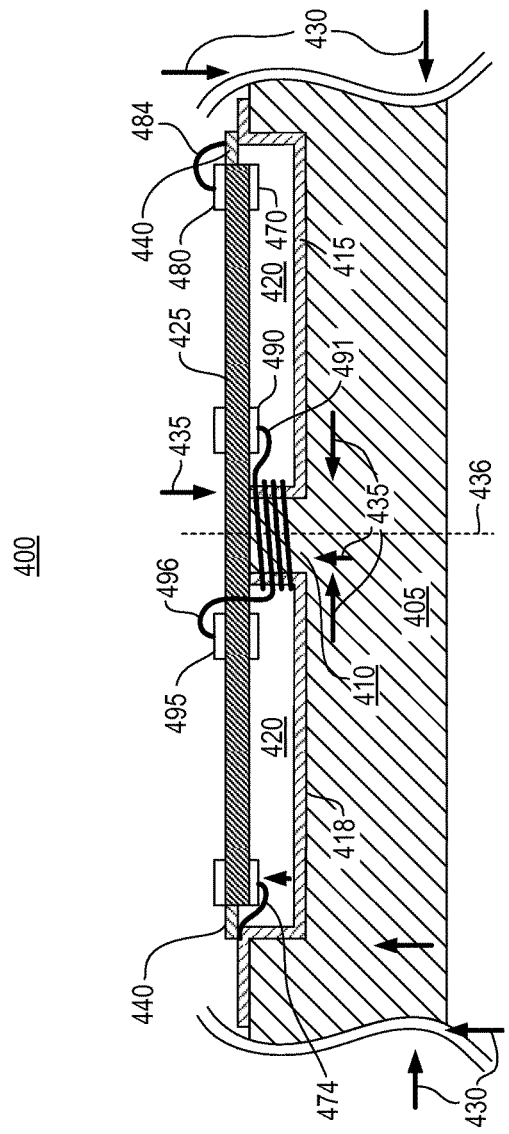
FIG. 4 is a diagram illustrating an acoustic resonator structure according to a representative embodiment.

Pillar 305 is illustratively silicon and typically forms part of an etched silicon wafer, as illustrated for example in FIG. 4. In some embodiments, pillar 305 can be replaced with a pillar formed of a material having lower thermal conductivity than silicon, such as a non-conductive oxide. This replacement of pillar 305 can provide improved thermal insulation for acoustic resonator 360. Illustrative examples of such a non-conductive oxide include but are not limited to silicon dioxide, which has much greater thermal resistance than pure silicon, or non-etchable boro-silica glass (NEBSG). Other materials within the purview of one of ordinary skill in the art having the benefit of the present disclosure are also contemplated for use as the materials of the pillar 305.

Acoustic resonator 360 comprises a lower electrode 315, a piezoelectric layer 320, and an upper electrode 325. At the same time that the lower electrode 315 is deposited and patterned, an "island" electrode 340 is formed covering a portion of the pedestal 350. As depicted in FIG. 3, the island electrode 340 is electrically isolated from lower electrode 315, and provides a conductive path between the upper electrode 325 and first contact 310. Lower and upper electrodes 315 and 325 and island electrode 340 are typically formed of a conductive material such as molybdenum, tungsten and/or ruthenium, or other materials described in certain referenced U.S. patents, U.S. Patent Application Publications, and U.S. patent applications referenced above.

Piezoelectric layer 320 comprises, for example, aluminum nitride (AlN), zinc oxide (ZnO), or lead zirconium titanate (PZT). The piezoelectric layer 320 comprises a highly-textured c-axis piezoelectric material. Notably, in a highly textured c-axis piezoelectric material, the c-axis orientations of the crystals of the piezoelectric material are well-collimated, and as such are parallel with one another and perpendicular to the plane of the electrodes (e.g., lower and upper electrodes 315, 325).

Lower electrode 315 is electrically connected to second contact 312 on the left side of pedestal 350, and upper electrode 325 is electrically connected to first contact 310 on the right side of pedestal 350 through the island electrode 340. More specifically, lower electrode 315 is in direct contact with second contact 312, while upper electrode 325 is connected to first contact 310 through island electrode 340. Although lower electrode 315 is shown as two discontinuous sections with pedestal 350 there between, these sections represent a single annulus and thus are electrically connected. Illustratively, the electrical connection between upper electrode 325 and first contact 310 is formed by a via 335 that connects to the island electrode 340 formed on pedestal 350 to a top portion of acoustic resonator 360. Island electrode 340 is typically formed of the same layer as lower electrode 315, but is electrically isolated from lower electrode 315. In other words, island electrode 340 can be viewed as a conductive island formed by removing a surrounding portion of lower electrode 315.

In the depicted embodiment, a spacer 330 is formed in a cavity between via 335 and piezoelectric layer 320. In some embodiments, spacer 330 is formed of a suitable dielectric material such as non-etchable borosilicate glass (NEBSG). In other embodiments, spacer 330 comprises an air cavity. Among other functions, spacer 330 functions to substantially prevent resonances from being generated above pedestal 350. The spacer 330 also has an annular shape and ensures that the upper electrode 325 does not form a parasitic resonance with the portion of the lower electrode 315 disposed beneath the spacer 330. Notably, the active area of the acoustic resonator 360 includes only the region where the lower and upper electrodes 315, 325 and piezoelectric layer 320 overlap and are in intimate contact with one another. As such, spacer 330 substantially prevents spurious modes from being generated between an area of lower electrode 315 directly above second contact 312, and a portion of metal connecting via 335 to the left side of upper electrode 325.

Acoustic resonator 360 has an active region defined by an overlap between lower electrode 315, the piezoelectric layer 320 and the upper electrode 325. As illustrated in FIG. 3, spacer 330 extends laterally so that no portion of upper electrode 325 is formed above pedestal 350. This allows the acoustic resonator 360 to resonate freely (i.e., substantially undamped) so that minimal energy is absorbed by pedestal 350.

During typical operation, an electrical input signal is applied between the lower electrode 315 and the upper electrode 325, causing piezoelectric layer 320 to mechanically expand and contract. As described in U.S. patents, U.S. Patent Application Publications, and U.S. patent applications referenced above, longitudinal bulk acoustic waves (also referred to as longitudinal modes or thickness extensional modes) propagate through piezoelectric layer 320 and generate a corresponding electrical output signal on upper electrode 325. Notably, known structures and methods to improve the performance of the acoustic resonator 360 are contemplated by the present teachings. For example, lower and upper electrodes 315 and 325 may be apodized, and frame elements may be provided in the structure. Certain known structures and methods useful in improving the performance of the acoustic resonator are described, for example, in U.S. patents, U.S. Patent Application Publications, and U.S. Patent Applications referenced above.

FIG. 4 is a diagram illustrating an acoustic resonator structure 400 according to a representative embodiment. In FIG. 4, a force field is shown to illustrate how a pedestal beneficially mechanically isolates the acoustic resonator structure 400 from surrounding features.

Referring to FIG. 4, acoustic resonator structure 400 comprises a substrate 405. Substrate 405 can be formed of various types of semiconductor materials compatible with semiconductor processes, such as silicon, gallium arsenide, indium phosphide, or the like, which is useful for integrating connections and electronics, thus reducing size and cost. A pair of trenches 420 is formed in substrate 405, and a pillar 410 (e.g., silicon or other material used for the substrate 405) is formed between trenches 420. "Pillar" may include electrical contacts for establishing electrical connections with the acoustic resonator 425, as discussed above. Due to their shape, trenches 420 may be referred to alternatively as a "swimming pool" structure by those of ordinary skill in the art.

First and second electrical contacts 415 and 418 are provided within trenches 420, and an acoustic resonator 425 is formed above trenches 420 and pillar 410. Acoustic resonator 425 can be any type of bulk acoustic resonator. For example, acoustic resonator 425 can be an FBAR, DBAR, CRF, or ZDR. For explanation purposes however, acoustic resonator 425 is illustratively an FBAR. In addition, although not depicted in detail in FIG. 4, acoustic resonator 425 comprises a lower electrode connected to a first contact on the pillar 410 that is connected to the first electrical contact 415, an upper electrode connected to a second contact on the pillar 410 that is connected to the second electrical contact 418, and a piezoelectric layer between the lower and upper electrodes. These electrodes can be connected to first and second electrical contacts 415 and 418 in a manner similar to the connection between first and second contacts 310 and 312 and lower and upper electrodes 315 and 325 in FIG. 3.

First and second electrical contacts 415 and 418, as well as the lower and upper electrodes of acoustic resonator 425, can be formed of various conductive materials, such as metals compatible with semiconductor processes, including tungsten, molybdenum, ruthenium, aluminum, platinum, ruthenium, niobium, or hafnium, for example. These features can also be formed with conductive sub-layers or in combination with other types of layers, such as temperature compensating layers. In addition, they can be formed of the same material, or they can be formed of different materials. For example, a thermal oxide layer or other thermal barrier (not shown) may be disposed along the bottom of the trenches 420. Such a thermal barrier helps to isolate the first and second electrical contacts 415 and 418 from the silicon "thermal reservoir" formed in the substrate 405. Otherwise, the first and second electrical contacts 415 and 418 may bring the reservoir temperature of the substrate 405 into contact with the pillar 410 and/or the acoustic resonator 425, which may result in excessive leakage of heat from the first and second electrical contacts 415 and 418.

The upper electrode of acoustic resonator 425 can further comprise a passivation layer (not shown), which can be formed of various types of materials, including aluminum nitride, silicon carbide, BSG, $SiO_2$, SiN, polysilicon, and the like. The thickness of the passivation layer should generally be sufficient to insulate the layers of acoustic resonator 425 from the environment, including protection from moisture, corrosives, contaminants, and debris.

In the depicted embodiment, acoustic resonator structure 400 further comprises tethers 440. Tethers 440 provide increased structural stability for acoustic resonator 425. Tethers 440 are attached to an outer periphery of the acoustic resonator 425, which may have an annular shape, for example. That is, tethers 440 can be attached between first and second electrical contacts 415 and 418 and outer edges of acoustic resonator 425. Alternatively, the tethers 440 can be electrically isolated from the first and second electrical contacts 415 and 418. The tethers 440 are configured to act essentially as "shock absorbers," limiting or damping transfer of externally applied forces, e.g., from the environment, to the acoustic resonator 425.

In addition, the acoustic resonator structure 400 may include an integrated outer heater 470 disposed around the outer perimeter of the annular acoustic resonator 425 and/or an integrated inner heater 490 disposed around the inner perimeter of the annular acoustic resonator 425. The outer and inner heaters 470 and 490 may be heater coils, formed by conductive traces on a bottom surface of the acoustic resonator 425 having resistances that generate heat upon application of respective heater currents, discussed below. Also, the outer and inner heaters 470 and 490 may have corresponding integrated outer and inner heat sensors 480 and 495, respectively. The outer and inner heat sensors 480 and 495 may be formed by conductive traces on a top surface of the acoustic resonator 425.

In the depicted embodiment, the outer heater 470 receives the heater current through a set of conductive traces, indicated by representative conductor 474, in one or more of the tethers 440, and the heat sensor 480 receives heat sensor current through another set of conductive traces, indicated by representative conductor 484, in one or more of the tethers 440 for sensing the temperature of the outer heater 470 and/or the acoustic resonator 425. The inner heater 490 receives the heater current through a set of conductive traces, indicated by representative conductor 491, wrapped around the pillar 410, and the inner heat sensor 495 receives the heat sensor current through another set of conductive traces, indicated by representative conductor 496, likewise wrapped around the pillar 410 for sensing the temperature of the inner heater 490 and/or the acoustic resonator 425. The conductors may be formed of any electrically conductive material such as tungsten, molybdenum and/or ruthenium, for example. In an embodiment, only one of the outer and inner heat sensors 480 or 495 may be included, and thus used to sense the temperature of both the outer and inner heaters 470 and 490 and/or the acoustic resonator 425.

A force field from intrinsic and/or extrinsic stimuli creates forces 430 on substrate 405. These stimuli can be caused by various factors, such as thermal expansion or contraction of a PCB connected to acoustic resonator structure 400, or attachment of a package containing acoustic resonator structure 400 to the PCB. Forces 430 are transmitted through silicon substrate to create forces 435 on pillar 410. However, because acoustic resonator 425 is connected to pillar 410 at a single central location, forces 435 are unable to exert any appreciable torque on acoustic resonator 425. Consequently, forces 435 have minimal impact on the frequency of acoustic resonator 425. In other words, forces 435 have much less influence on the center frequency of acoustic resonator 425 compared with forces 130 of FIG. 1A.

Although not shown in FIG. 4, acoustic resonator structure 400 is typically covered by a microcap structure bonded to substrate 405. The microcap structure can be formed of etched silicon or another material and enables hermetic sealing of the acoustic resonator 425. Additional details of methods, materials and assembly of a microcap structure to a base substrate may be found, for example in one or more of commonly owned U.S. Pat. Nos. 6,228,675; 6,265,246; 6,429,511; 6,787,897; 6,919,222; 6,979,597; and 7,161,283, the disclosures of which are hereby incorporated by reference as if set forth herein. In some embodiments, however, the microcap structure can be omitted.

In the embodiment depicted in and described in connection with FIG. 4, the pillar 410 is "centered" between trenches 420 and beneath the acoustic resonator 425. As such, the acoustic resonator 425 is disposed symmetrically about a line 436 bisecting the pillar 410. In other embodiments contemplated by the present teachings, the pillar 410 may be "offset" and the acoustic resonator 425 is not disposed symmetrically about line 436 bisecting the pillar. Off-setting the pillar is a form of "apodization", where no two path lengths for lateral modes are the same. This causes a "smearing" of the lateral modes. Examples of an offset pillar 410 are described by Ruby, et al. in U.S. patent application Ser. No. 13/216,633, entitled "Acoustic Resonator Formed on a Pedestal," filed on Aug. 24, 2011, which is hereby incorporated by reference.

Figure 5A:
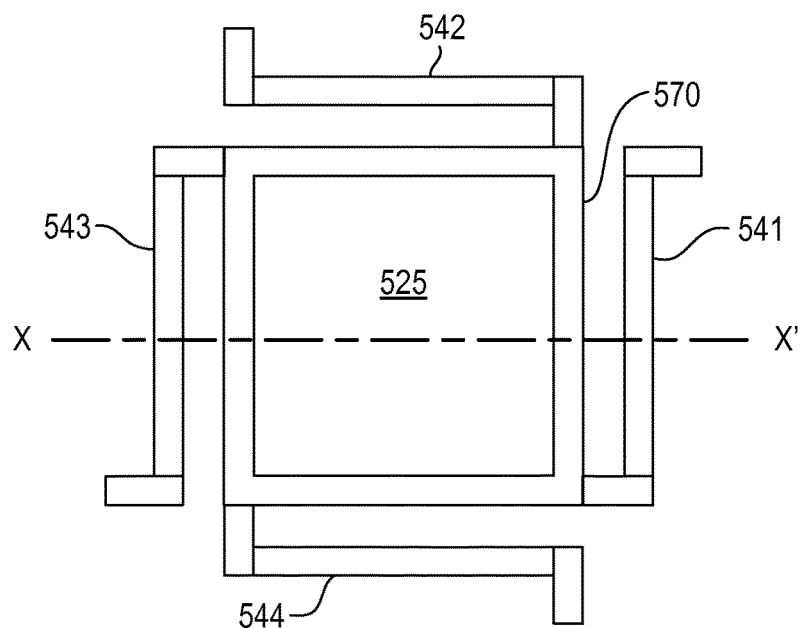
FIGS. 5A and 5B are diagrams illustrating an acoustic resonator structure according to a representative embodiment.
Figure 5B:
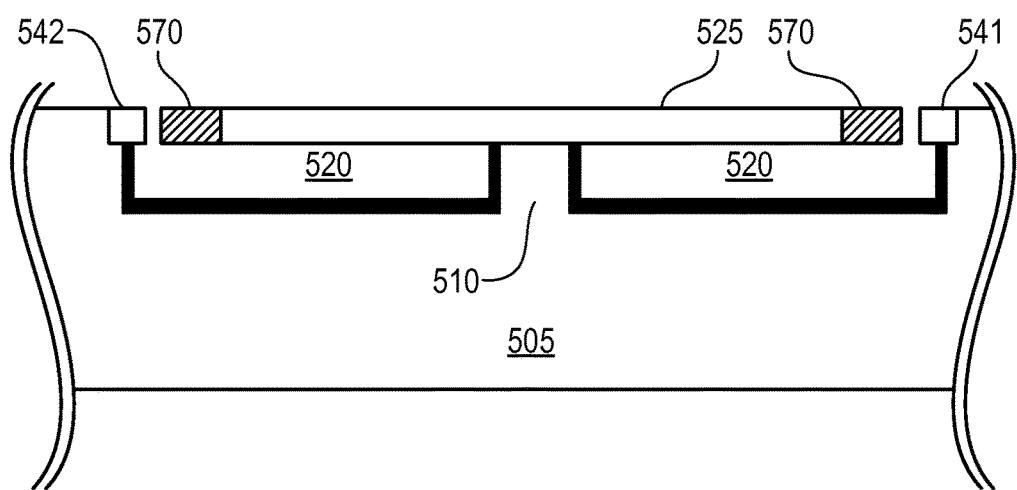

FIG. 5A is a top planar view of an acoustic resonator structure, according to an embodiment, and FIG. 5B is a cross-section view of the acoustic resonator structure of FIG. 5A, taken along X-X'.

Referring to FIGS. 5A and 5B, acoustic resonator structure 500 includes acoustic resonator 525 suspended over trenches 520 in substrate 505. The acoustic resonator 525 is secured in the center region by pillar 510 and secured at the edges by tethers 541-544. A heating coil 570 is disposed around the other edges of the acoustic resonator 525, and is in thermal communication with a piezoelectric layer (not shown) of the acoustic resonator 525. In the depicted embodiment, the heating coil 570 is formed at substantially the same level as the acoustic resonator 525, although in various alternative embodiments, the heating coil 570 may be formed on a top or bottom surface of the acoustic resonator 525, or of an exposed portion of the piezoelectric layer (as discussed below), without departing from the scope of the present teachings. Also, in alternative embodiments, a heat sensor (not shown) is likewise disposed around all or a portion of the other edges of the acoustic resonator 525 in close proximately (e.g., substantially adjacent) to the heater coil 570 in order to enable detection and/or control of the temperature of the acoustic resonator 525 (as discussed below).

Each of the tethers 541-544 is designed to be flexible to enable some movement of the acoustic resonator 525, while providing mechanical support. Thus, the tethers 541-544 are able to limit or damp transfer of externally applied forces, e.g., from the environment, to the acoustic resonator 525. The tethers 541-544 also suspend portions of the acoustic resonator 525 over the trenches 520 in the substrate 505 between the outer edges of the acoustic resonator 525 and the pillar 510. In the depicted embodiment, each of the tethers 541-544 has a spring-like configuration formed by corresponding lever arms that run substantially parallel to the outer edges of the acoustic resonator 525 and/or the heater coil 570. Also, one or more of the tethers 541-544 may include conductive traces to provide electrical current to the heater coil 570 and/or the heat sensor. Of course, the shape of the resonator 525, the shape and location of the heater coil 570, and the configuration of the tethers 541-544 (including the number and arrangement of respective lever arms) may vary, without departing from the scope of the present teachings.

Figure 6A:
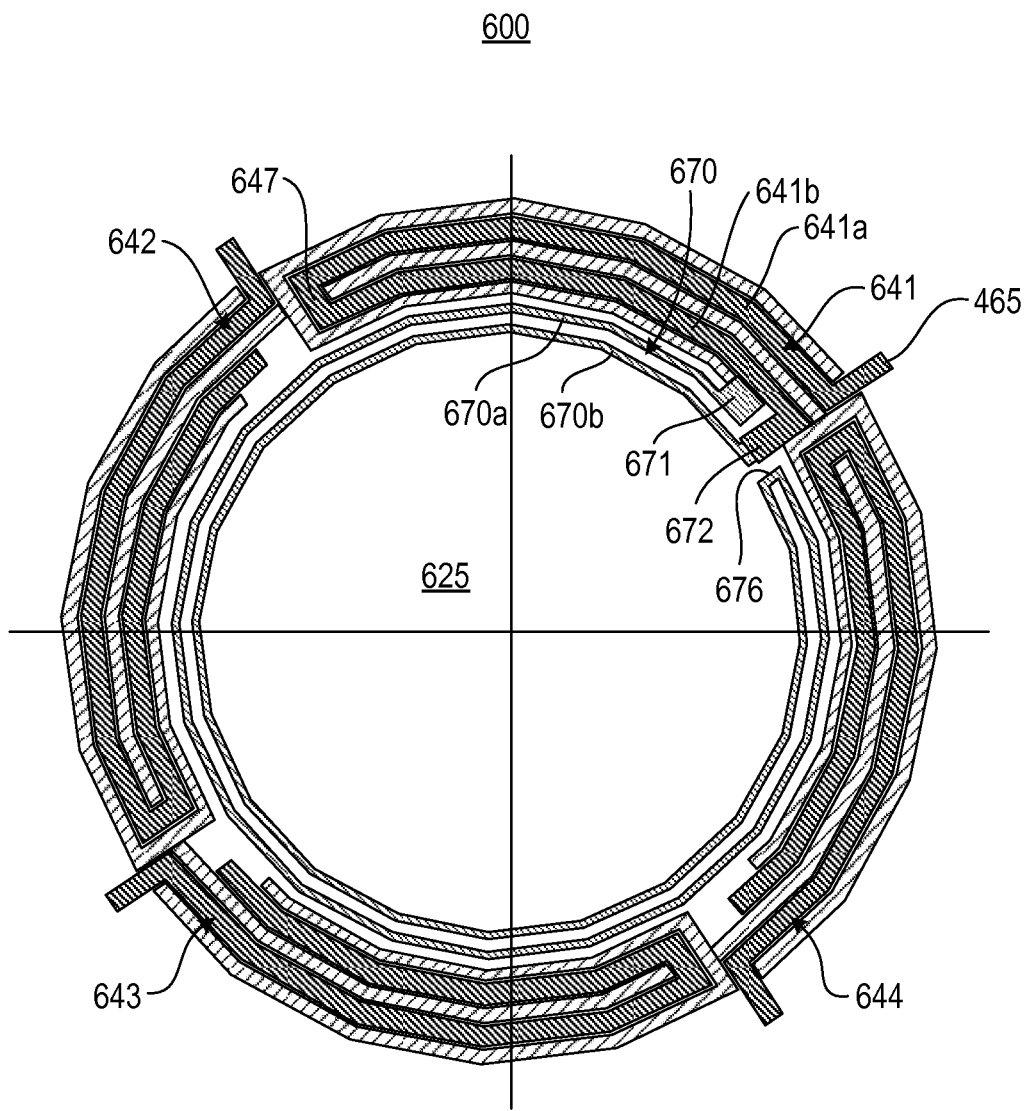
FIGS. 6A and 6B are diagrams illustrating acoustic resonator structures according to representative embodiments.

FIG. 6A is a diagram illustrating an acoustic resonator structure according to a representative embodiment, and providing more detail than FIG. 5.

In the depicted embodiment, acoustic resonator device 600 includes circular acoustic resonator 625, which is positioned over a trench (e.g., trenches 520) formed in the substrate (e.g., substrate 505). The acoustic resonator 625 may be annular, as discussed above with reference to FIG. 3, in which case a circular opening would be formed in the center region of the acoustic resonator 625. The acoustic resonator 625 may include a piezoelectric layer (e.g., piezoelectric layer 320) formed between lower and upper electrodes (e.g., electrodes 315 and 325), where the piezoelectric layer extends beyond the outer edges of the lower and upper electrodes. In other words, a diameter of the piezoelectric layer is greater than a diameter of each of the lower and upper electrodes. A heater coil 670 is disposed circumferentially around an outer perimeter of the acoustic resonator 625. In an embodiment, the heater coil 670 is formed on a bottom surface of the piezoelectric layer that extends beyond the lower electrode, although the heater coil 670 may be in mechanical and/or thermal contact the piezoelectric layer in alternative configurations, without departing from the scope of the present teachings.

The acoustic resonator device 600 further includes four tethers, first through fourth tethers 641-644, connected to the outer perimeter of the acoustic resonator 625. The tethers 641-644 limit or damp transfer of forces to the acoustic resonator 625. The tethers 641-644 also suspend the acoustic resonator 625 over a trench, either entirely or at least between outer edges of the acoustic resonator 625 and a pillar (e.g., pillar 510). In the depicted embodiment, the first through fourth tethers 641-644 are arranged symmetrically around the circumference of the acoustic resonator 625, such that they are connected at intervals equal to one quarter of the circumference (i.e., 90 degrees apart). The first through fourth tethers 641-644 provide mechanical support to the outer circumference of the acoustic resonator 625. In various embodiments, the acoustic resonator 625 is also supported the center region by a pillar (not shown) (e.g., pillar 510), as discussed above.

The first through fourth tethers 641-644 are approximately equal in length and have the same general configuration. For example, in the depicted embodiment, each of the first through fourth tethers 641-644 has two lever arms extending around a portion of the circumference of the acoustic resonator 625 and connected by a joint. Referring to the first tether 641 as an example, first lever arm 641a extends from input 645 around approximately one quarter of the circumference of the acoustic resonator 625, and connects with second lever arm 641b via joint 647. The second lever arm 641b extends in the opposite direction around approximately one quarter of the circumference of the acoustic resonator 625, concentrically within the first lever arm 641a. In the depicted embodiment, the second lever arm 641b mechanically connects with the outer edge of the resonator 625, and electrically connects with the heater coil 670 at heater coil input 671 and heater coil output 672, as discussed below. The first and second lever arms of the second through fourth tethers 642-644, respectively, have substantially the same configurations for connected to the outer edge of the resonator 625. However, the second lever arms do not necessarily electrically connect with the heater coil 670. The arrangement of the lever arms provide the first through fourth tethers 641-644 with spring like characteristics, mechanically supporting the acoustic resonator 625, while maintaining some flexibility.

In an embodiment, at least the first tether 641 includes two conductors for providing heater current $I_H$ to the heater coil 670. For example, the first tether 641 may include a membrane, e.g., formed of a piezoelectric material or a dielectric material, and traces or layers of conductive material formed on opposite sides of the membrane. For example, a first conductive trace may be formed on a bottom surface of the membrane and a second conductive trace may be formed on a top surface of the membrane. The first and second conductive traces may be formed of a conductive material, such as tungsten, molybdenum and/or ruthenium. In an embodiment, the first and/or second conductive traces may be formed of the same material as the lower and/or upper electrodes of the acoustic resonator 625, thus saving processing steps, e.g., including process layers with attendant mask layers and etching. The first conductive trace electrically connects to the heater coil 670 at the heater coil input 671 to input the heater current $I_H$, and the second conductive trace electrically connects to the heater coil 670 at the heater coil output 672 to enable return of the heater current $I_H$.

The heater coil 670 is formed from a trace or layer of conductive material, such as tungsten, molybdenum and/or ruthenium, with resistive properties causing the heater coil 670 to increase in temperature when heater current $I_H$ is applied to the heater coil input 671. In the depicted embodiment, the heater coil 670 forms two concentric loops substantially around the outer perimeter of the acoustic resonator 625, so that both the heater coil input 671 and the heater coil output 672 are positioned at the connection with the first tether 641. This enables the heater current $I_H$ to be input and returned via the first and second conductive traces, as discussed above. More particularly, an outer loop 670a of the heater coil 670 is connected to the first conductive trace in the first tether 641, and extends circumferentially around the outer perimeter of the acoustic resonator 625 to almost its starting point. There, the outer loop 670a connects with an inner loop 670b via connector 676. The inner loop 670b extends circumferentially around the outer perimeter of the acoustic resonator 625 in the opposite direction, concentrically within the outer loop 670a, to slightly past the starting point of the outer loop 670a, where it connects to the second conductive trace in the first tether 641. In an embodiment, the inner loop 670b connects to the second conductive trace by way of a via through the membrane of the first tether 641 since the second conductive trace is on the top surface of the membrane.

In the present example, the heater coil 670 may have a width of about 1.5 μm and a thickness of about 300 Å to about 1000 Å, and the sheet ρ of the conductive material may be about 5-100/square. The radius of the outer loop 670a may be about 88 μm and a radius of the inner loop 670b may be about 78 μm, for example. Accordingly, the heater coil 670 has about 700 squares, which provides a resistance of about 1000Ω to about 5000Ω. This provides a thermal output of about 2 mW to about 4 mW when 3.3V is applied.

Figure 6B:
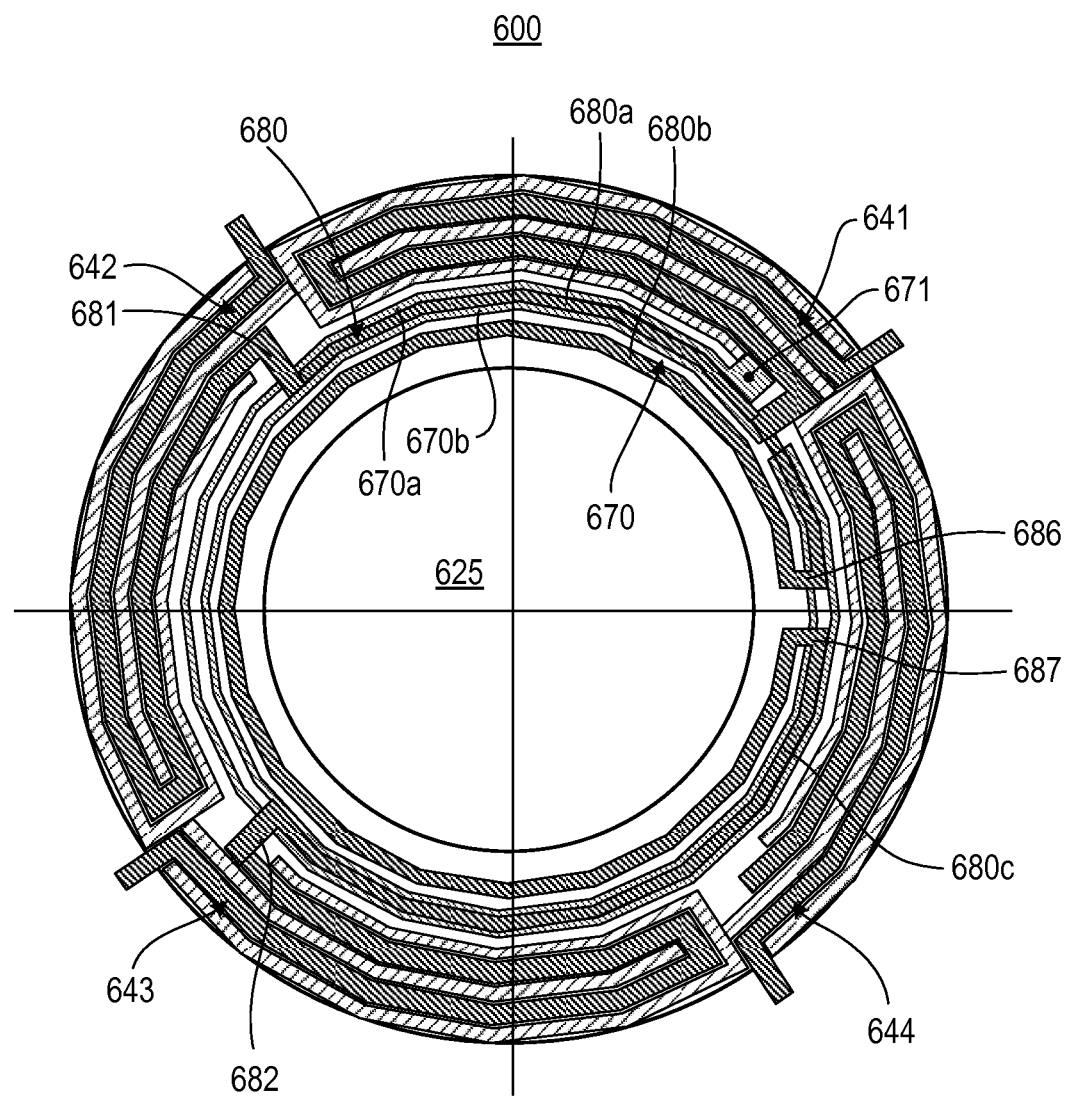

FIG. 6B is a diagram illustrating an acoustic resonator structure according to a representative embodiment. More particularly, FIG. 6B shows the acoustic resonator structure 600 further including a heat sensor 680.

Referring to FIG. 6B, heat sensor 680 is disposed circumferentially around the outer perimeter of the acoustic resonator 625, in close proximity (e.g., substantially adjacent) to the heater coil 670 in order to react to the heater generated by the heater coil 670 and/or temperature changes in the acoustic resonator 625. In an embodiment, the heater coil 670 is formed on a top surface of the piezoelectric layer that extends beyond the upper electrode, as discussed above, although the heat sensor 680 may be arranged elsewhere in the vicinity of the heater coil 670, without departing from the scope of the present teachings.

The heat sensor 680 is formed from a trace or layer of conductive material, such as tungsten, molybdenum and/or ruthenium. The resistance of the heat sensor 680 generally changes proportionately with changes in temperature of the acoustic resonator 625. That is, the resistance of the heat sensor 680 increases in response to a constant heat sensor current $I_{HS}$ as the temperature of the acoustic resonator 625 increases. The resistance of the heat sensor 680 may be compared to a reference resistance in order to determine when to turn the heater coil on and off to maintain a desired temperature of the acoustic resonator 625, as discussed below.

In the depicted embodiment, the heat sensor 680 forms two concentric loops partially around the outer perimeter of the acoustic resonator 625. A first outer loop portion 680a of the heat sensor 680 is connected to a conductive trace in the tether 642 at heat sensor input 681, and extends circumferentially around about a quarter of the circumference of the outer perimeter of the acoustic resonator 625. There, the first outer loop portion 680a connects with an inner loop 680b via connector 686. The inner loop 680b extends circumferentially in the opposite direction around almost the entire circumference of the acoustic resonator 625, concentrically within the outer loop 680a. There, the inner loop 680b connects with a second outer loop portion 680c via connector 687. The second outer loop portion 680c extends circumferentially in the opposite direction around about a quarter of the circumference of the outer perimeter of the acoustic resonator 625, and is connected to a conductive trace in the tether 643 at heat sensor output 682. Thus, the heat sensor current $I_{HS}$ is applied to the heat sensor 680 at the heat sensor input 681 and returned at the heat sensor output 682.

Figure 7:
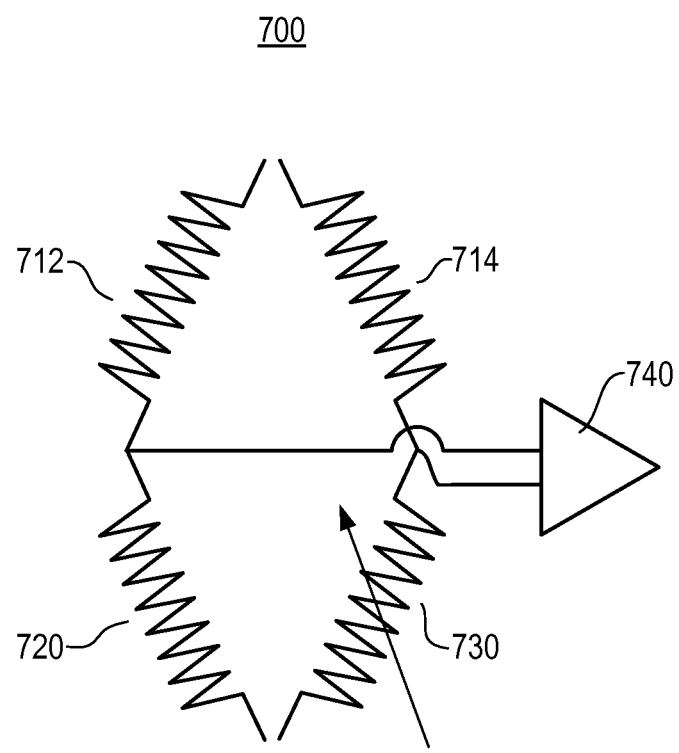
FIG. 7 is a diagram illustrating a heater feedback circuit of an acoustic resonator structure according to a representative embodiment.

As mentioned above, the heat sensor 680 may be part of a feedback circuit that adjusts application of the heater current $I_H$ in response to the sensed temperature of the acoustic resonator 625 and/or the heat sensor 680. FIG. 7 is a diagram illustrating a temperature feedback circuit of an acoustic resonator structure according to a representative embodiment.

Referring to FIG. 7, feedback circuit 700 is essentially a Wheatstone bridge. The feedback circuit 700 includes large value resistors 712 and 714, which may be located on the pedestal (e.g., pedestal 510) supporting the acoustic resonator 625. The large value resistor 712 and 714 may have resistances of about 100Ω, for example. The feedback circuit 700 further includes reference resistor 720 and heat sensor resistor 730. The reference resistor 720, which may be located off-chip (e.g., on an FBAR wafer), may have a resistance of about 1.5Ω, for example. The heat sensor resistor 730 is indicated as a variable resistor, since its value varies in response to the heat generated by the heater coil 670. For example, the heat sensor resistor 730 may vary in resistance form about 1Ω to about 2Ω (the value of the reference resistor 720).

Transimpedance amplifier (TIA) 740 of the feedback circuit 700 receive voltages from the node between the large value resistor 712 and the reference resistor 720 and from the large value resistor 714 and the heat sensor resistor 730, and determines the difference between the receive voltages. The TIA converts the voltage difference into a bias current $I_{bias}$ that is applied to the heater current $I_H$ in order to adjust the heat provided by the heater coil 670. For example, when the resistance of the heat sensor resistor 730 is less than the resistance of the reference resistor 720, indicating a lower than desired temperature, the TIA 740 detects a voltage difference across the Wheatstone bridge, and applies a positive bias current $I_{bias}$ to increase the magnitude of the heater current $I_H$, thus increasing the amount of heat energy generated by the heater coil 670. Likewise, when the resistance of the heat sensor resistor 730 is greater than the reference resistor, indicating a higher than desired temperature, the TIA 740 detects a negative voltage difference across the Wheatstone bridge, and applies a negative bias current $I_{bias}$ to reduce the magnitude of the heater current $I_H$, thus decreasing the amount of heat energy generated by the heater coil 670. When the resistances of the heat sensor resistor 730 and the reference resistor 720 are equal, the TIA 740 detects no voltage difference and thus applies no bias current $I_{bias}$. In this manner, the temperature of the acoustic resonator 625 is kept substantially constant.

Figure 8:
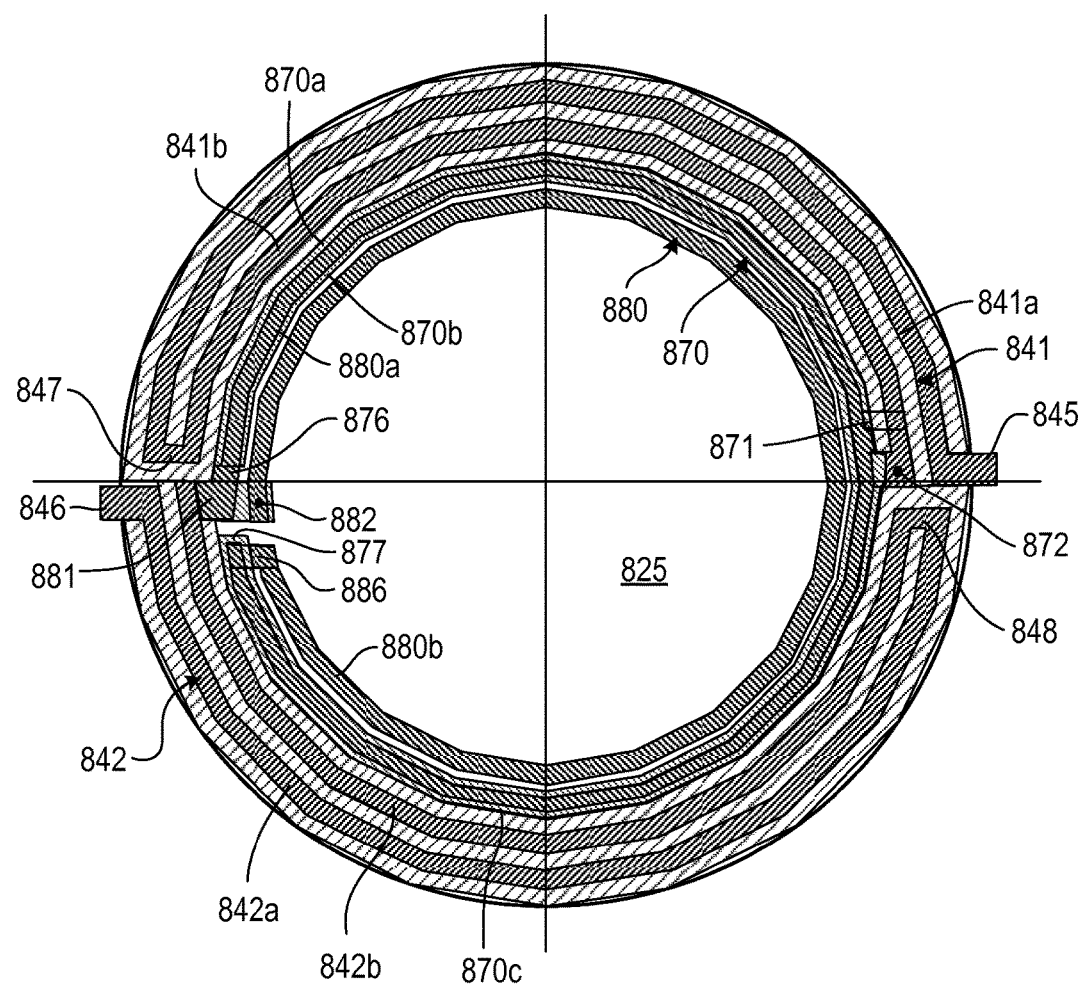
FIG. 8 is a diagram illustrating an acoustic resonator structure according to a representative embodiment.

FIG. 8 is a diagram illustrating an acoustic resonator structure according to another representative embodiment. More particularly, FIG. 8 depicts acoustic resonator structure 800, which is substantially the same as the acoustic resonator structure 600 in FIGS. 6A and 6B, except that acoustic resonator structure 800 includes two tethers (first and second tethers 841 and 842), as opposed to four tethers.

Referring to FIG. 8, acoustic resonator device 800 includes circular acoustic resonator 825, which is positioned over a trench (e.g., trenches 520) formed in the substrate (e.g., substrate 505). The acoustic resonator 825 may be annular, as discussed above with reference to FIG. 3, in which case a circular opening would be formed in the center region of the acoustic resonator 825. The acoustic resonator 825 may include a piezoelectric layer (e.g., piezoelectric layer 320) formed between lower and upper electrodes (e.g., electrodes 315 and 325), where the piezoelectric layer extends beyond the outer edges of the lower and upper electrodes. In other words, a diameter of the piezoelectric layer is greater than a diameter of each of the lower and upper electrodes. A heater coil 870 and a heat sensor 880 are disposed circumferentially around an outer perimeter of the acoustic resonator 825. In an embodiment, the heater coil 870 is formed on a bottom surface of the piezoelectric layer that extends beyond the lower electrode, and the heat sensor 880 is formed on a top surface of the piezoelectric layer that extends beyond the upper electrode. However, the configurations of the heater coil 870 and the heat sensor 880 may vary, without departing from the scope of the present teachings.

The acoustic resonator device 800 further includes the first and second tethers 841 and 842, connected to the outer perimeter of the acoustic resonator 825. The tethers 841-842 limit or damp transfer of forces to the acoustic resonator 825. The tethers 841-842 also suspend the acoustic resonator 825 over a trench, either entirely or at least between outer edges of the acoustic resonator 825 and a pillar (e.g., pillar 510). In the depicted embodiment, the first and second tethers 841 and 842 are arranged symmetrically around the circumference of the acoustic resonator 825, such that they are connected at intervals equal to one half of the circumference (i.e., 180 degrees apart). The first and second tethers 841 and 842 provide mechanical support to the outer circumference of the acoustic resonator 825. In various embodiments, the acoustic resonator 825 is also supported the center region by a pillar (not shown) (e.g., pillar 510), as discussed above.

The first and second tethers 841 and 842 are approximately equal in length and have the same general configuration. For example, in the depicted embodiment, each of the first and second tethers 841 and 842 has two lever arms extending around a portion of the circumference of the acoustic resonator 825 and connected by a joint. Referring to the first tether 841 as an example, first lever arm 841*a* extends from input 845 around approximately one half of the circumference of the acoustic resonator 825, and connects with second lever arm 841*b* via joint 847. The second lever arm 841*b* extends in the opposite direction around approximately one half of the circumference of the acoustic resonator 825, concentrically within the first lever arm 841*a*. In the depicted embodiment, the second lever arm 841*b* mechanically connects with the outer edge of the resonator 825, and electrically connects with the heater coil 870 at heater coil input 871 and heater coil output 872, as discussed below.

The first and second lever arms 842*a* and 842*b* of the second tether 842 have substantially the same configuration for connecting to the outer edge of the resonator 825. However, the second lever arm 842*a* electrically connects with the heat sensor 880 as opposed to the heater coil 870. That is, the first lever arm 842*a* extends from input 846 around approximately one half of the circumference of the acoustic resonator 825, and connects with second lever arm 842*b* via joint 848. The second lever arm 842*b* of the second tether 842 extends in the opposite direction around approximately one half of the circumference of the acoustic resonator 825, concentrically within the first lever arm 842*a*. In the depicted embodiment, the second lever arm 842*b* mechanically connects with the outer edge of the resonator 825, and electrically connects with the heat sensor 880 at heat sensor input 881 and heat sensor output 882, as discussed below. The arrangement of the lever arms provide the first and second tethers 841 and 842 with spring like characteristics, mechanically supporting acoustic resonator 825, while maintaining some flexibility.

In an embodiment, the first tether 841 and the second tether 842 each include two conductors for providing heater current $I_H$ to the heater coil 870 and heat sensor current $I_{HS}$ to the heat sensor 880, respectively. For example, each of the first tether 841 and the second tether 842 may include a membrane, e.g., formed of a piezoelectric material or a dielectric material, and traces or layers of conductive material formed on opposite sides of the membrane. For example, a first conductive trace may be formed on a bottom surface of the membrane and a second conductive trace may be formed on a top surface of the membrane. The first and second conductive traces may be formed of a conductive material, such as tungsten, molybdenum and/or ruthenium. The first conductive trace of the first tether 841 may electrically connect to the heater coil 870 at the heater coil input 871 to input the heater current $I_H$, and the second conductive trace may electrically connect to the heater coil 870 at the heater coil output 872 to enable return of the heater current $I_H$. Likewise, the first conductive trace of the second tether 842 may electrically connect to the heat sensor 880 at the heat sensor input 881 to input the heat sensor current $I_{HS}$, and the second conductive trace may electrically connect to the heater coil 870 at the heater coil output 872 to enable return of the heater current $I_H$.

The heater coil 870 and the heat sensor 880 may formed from a trace or layer of conductive material, such as tungsten, molybdenum and/or ruthenium, as discussed above with regard to the heater coil 670 and the heat sensor 680. In the depicted embodiment, the heater coil 870 forms two concentric loops substantially around the outer perimeter of the acoustic resonator 825, so that both the heater coil input 871 and the heater coil output 872 are positioned at the connection with the first tether 841. This enables the heater current $I_H$ to be input and returned via the first and second conductive traces, as discussed above.

More particularly, a first outer loop portion 870*a* of the heater coil 870 is connected to the first conductive trace in the first tether 841 at heater coil input 871, and extends circumferentially around about a half of the circumference of the outer perimeter of the acoustic resonator 825. There, the first outer loop portion 870*a* connects with an inner loop 870*b* via connector 876. The inner loop 870*b* extends circumferentially in the opposite direction around almost the entire circumference of the acoustic resonator 825, concentrically within the first outer loop portion 870*a*. There, the inner loop 870*b* connects with a second outer loop portion 870*c* via connector 877. The second outer loop portion 870*c* extends circumferentially in the opposite direction around about a half of the circumference of the outer perimeter of the acoustic resonator 825, and is connected to the second conductive trace in the second tether 842 at heater coil output 872. In an embodiment, the second outer loop portion 870*c* connects to the second conductive trace by way of a via through the membrane of the first tether 841 since the second conductive trace is on the top surface of the membrane.

Similarly, an outer loop 880*a* of the heat sensor 880 is connected to the first conductive trace in the second tether 842 at heat sensor input 881, and extends circumferentially around the outer perimeter of the acoustic resonator 825 to almost its starting point. There, the outer loop 880*a* connects with an inner loop 880*b* via connector 886. The inner loop 880*b* extends circumferentially around the outer perimeter of the acoustic resonator 825 in the opposite direction, concentrically within the outer loop 880*a*, to slightly past the starting point of the outer loop 880*a*, where it connects to the second conductive trace in the second tether 842 at heat sensor output 882. In an embodiment, the inner loop 880*b* connects to the second conductive trace by way of a via through the membrane of the second tether 842 since the second conductive trace is on the top surface of the membrane.

The thermal output of the heater coil 870 may be substantially the same as that of the heater coil 670, discussed above. That is, in the present example, the heater coil 870 may have a width of about 1.5 µm and a thickness of about 500 Å to about 600 Å, and the sheet ρ of the conductive material may be about 5-10 Ω/square. The radius of the combined first outer loop portion 870*a* and second outer loop portion 870*c* may be about 88 µm and the radius of the inner loop 870*b* may be about 78 µm, for example. Accordingly, the heater coil 870 has about 700 squares, which provides a resistance of about 2500Ω to about 3400Ω. This provides a thermal output of about 2 mW to about 4 mW when 3.3V is applied. To put reasonable bounds on the design of the heater coil 870, the applied voltages from battery sources range from about 1V to about 9V. The goal is to get the maximum temperature for an applied amount of heat, and to minimize the power needed to supply heat.

When the thermal design of the pedestal and acoustic resonator is done correctly, the total power should be less than 100 mW. Thus, the range in currents may be about 100 mA for a 1 V source to about 10 mA for a 10 V source, for example. Therefore, the range of resistor values may be about 10Ω to about 1000Ω for the low side of resistor values, and when the thermal design is 100× better, the amount of total power may be only about 1 mW. Here, the range of currents would be about 1 mA to about 0.1 mA. This correlates to resistive values on the order of about 1000Ω to about 10,000Ω. The thickness and width of the resistive heater coil 870 may be adjusted accordingly.

As mentioned above, when the acoustic resonator is annular, the various embodiments may provide for a heater coil around an outer parameter of the acoustic resonator (e.g., as discussed with reference to FIGS. 6A-8), an inner parameter of the acoustic resonator (e.g., as discussed with reference to FIG. 3), or both. Methods of fabricating an acoustic resonator structure to include a pedestal are described, for example, by Ruby, et al. in U.S. patent application Ser. No. 13/216,633, entitled "Acoustic Resonator Formed on a Pedestal," filed on Aug. 24, 2011, which is hereby incorporated by reference.

Figure 9:
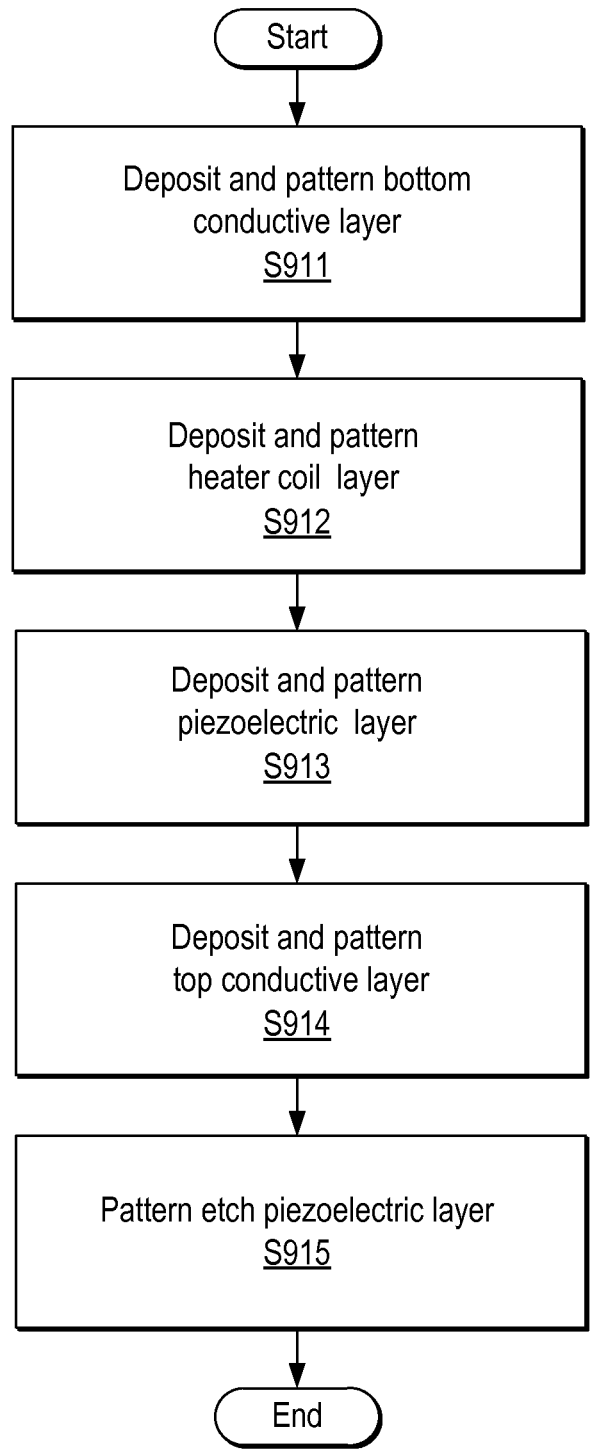
FIG. 9 is a flowchart illustrating a method of fabricating an acoustic resonator structure according to a representative embodiment.

FIG. 9 is a flowchart illustrating a method of fabricating an acoustic resonator structure according to a representative embodiment. In particular, FIG. 9 illustrates the method of fabrication the acoustic resonator structure 600 of FIG. 6A, including the first through fourth tethers 641-644 and the heater coil 670, for purposes of illustration. The acoustic resonator structure 600 of FIG. 6B would be fabricated in much the same manner, except that the conductive trace from the heat sensor 680 would be on the top surface of the piezoelectric layer, as opposed to the bottom surface.

Referring to FIG. 9, the method begins by depositing a bottom conductive layer on an upper surface of the silicon substrate, and patterning the bottom conductive layer to obtain a bottom conductive trace (S911). The bottom conductive trace corresponds to the first conductive trace of the first tether 641, for example. The bottom conductive trace is formed of a conductive material, such as tungsten, molybdenum and/or ruthenium, and may be about 6 µm wide (counting on about 1.5 µm to 2.0 µm pull-back). In various embodiments, all or a portion of the bottom conductive layer may be deposited contemporaneously with forming the lower electrode of the acoustic resonator 625. Next, the method includes depositing another conductive layer, and patterning the conductive layer to obtain the heater coil 670 (S912). The heater coil 670 is formed of a conductive material, such as tungsten, molybdenum and/or ruthenium, and may be about 2.0 µm wide with about 3.5 µm spacing between inner and outer loops (e.g., outer loop 670*a* and inner loop 670*b*). Depositing the heater coil 670 creates electric contact between the heater coil input 671 and the first conductive trace.

A piezoelectric layer is deposited over the bottom conductive trace and the heater coil 670, and patterned over the bottom conductive trace to substantially match the same (S613). This process provides the membrane of the corresponding tether (e.g., first tether 641), as well as the surface to which the heater coil 670 is attached. In various embodiments, all or a portion of the piezoelectric layer may be deposited contemporaneously with forming the piezoelectric layer of the acoustic resonator 625. The piezoelectric layer may be pattern using a DF mask, for example.

Next, the method includes depositing a top conductive layer over the piezoelectric pattern, and patterning the top conductive layer to obtain a top conductive trace (S914). The top conductive trace corresponds to the second conductive trace of the first tether 641, for example. The top conductive trace is formed of a conductive material, such as tungsten, molybdenum and/or ruthenium, and may be about 5 µm wide (counting on about 1.0 µm undercut). In various embodiments, all or a portion of the top conductive layer may be deposited contemporaneously with forming the upper electrode of the acoustic resonator 625. The piezoelectric layer is again etched to form the via between the heater coil 670 and the top conductive layer. Thus, forming the via creates electric contact between the heater coil output 672 and the second conductive trace, as discussed above.

While example embodiments are disclosed herein, one of ordinary skill in the art will appreciate that many variations that are in accordance with the present teachings are possible and remain within the scope of the appended claims. The invention therefore is not to be restricted except within the scope of the appended claims.

The invention claimed is:

1. An acoustic resonator device, comprising:
    an acoustic resonator positioned over a trench formed in a substrate;
    a heater coil disposed along a substantially entire perimeter of the acoustic resonator, the heater coil comprising a resistor configured to receive a heater current; and
    a heat sensor configured to adjust the heater current in response to a temperature of the heater coil.

2. The acoustic resonator device of claim 1, further comprising:
    a plurality of tethers connected to the acoustic resonator, the plurality of tethers being configured to limit transfer of externally applied forces to the acoustic resonator.

3. The acoustic resonator device of claim 2, wherein a first tether of the plurality of tethers comprises a first conductive trace for providing the heater current to the heater coil.

4. The acoustic resonator device of claim 3, wherein a second tether of the plurality of tethers comprises a second conductive trace for providing heat sensor current to the heat sensor, a change in the temperature of the heater coil causing a corresponding change in sensor resistance of the heat sensor.

5. The acoustic resonator device of claim 4, further comprising:
    a reference resistor have a predetermined reference resistance; and a transimpedance amplifier configured to sense a voltage caused by a difference between the sensor resistance and the predetermined reference resistance and to convert the sensed voltage into a bias current for adjusting the heater current.

6. The acoustic resonator device of claim 3, wherein the first conductive trace for providing the heater current to the heater coil comprises a metal trace having a thickness of about 300 Å to about 1000 Å, and wherein the heater coil comprises a heater resistor having a resistance between about 100Ω and about 5000Ω.

7. The acoustic resonator device of claim 6, wherein the metal trace of the heater coil comprises at least one of molybdenum, tungsten and ruthenium.

8. The acoustic resonator device of claim 3, wherein the first tether comprises:
a membrane, the first conductive trace being formed on a first surface of the membrane; and
a second conductive trace formed on a second surface of the membrane, opposite the first surface, the second conductive trace being configured to provide a return path for the heater current, wherein the membrane defines a via through which the first conductive trace being formed on the first surface of the membrane electrically connects with the heater coil.

9. The acoustic resonator device of claim 2, wherein the plurality of tethers includes four tethers, each tether being approximately equal in length and having two lever arms, and each lever arm extending along approximately one quarter of a circumference of the acoustic resonator.

10. The acoustic resonator device of claim 2, wherein the plurality of tethers includes two tethers, each tether being approximately equal in length and having two lever arms, and each lever arm extending along approximately one half of a circumference of the acoustic resonator.

11. The acoustic resonator device of claim 1, wherein the heat sensor is disposed along the substantially entire perimeter of the acoustic resonator substantially adjacent to the heater coil.

12. The acoustic resonator device of claim 1, wherein the acoustic resonator is annular, the acoustic resonator device further comprising:
a pillar formed in the trench, the pillar supporting the acoustic resonator at a central location; and
a conductor wound around the pillar for providing the heater current to the heater coil,
wherein the heater coil is disposed around an inner perimeter of the acoustic resonator.

13. An acoustic resonator device, comprising:
a substrate incorporating a trench;
an acoustic resonator suspended over the trench, the acoustic resonator comprising a first electrode, a piezoelectric layer stacked on the first electrode and a second electrode stacked on the piezoelectric layer, a portion of the piezoelectric layer extending beyond an outer edge of the first electrode;
a heater coil disposed along a substantially entire perimeter of the acoustic resonator on a first surface of the portion of the piezoelectric layer extending past the outer edge of the first electrode;
a heat sensor disposed along the substantially entire perimeter of the acoustic resonator on a second surface of the portion of the piezoelectric layer extending beyond the outer edge of the first electrode, and opposite the first surface, wherein the heat sensor is configured to adjust heater current to the heater coil based on a temperature of the heater coil;
a pillar disposed in the trench, the pillar supporting the acoustic resonator at a central location, the pillar comprising; and
a set of electrical contacts formed in the trench.

14. The acoustic resonator device of claim 13, further comprising:
a plurality of tethers connected to the substantially entire perimeter of the acoustic resonator and configured to suspend the acoustic resonator over the trench, a first tether of the plurality of tethers comprising a first conductive trace for providing heater current to the heater coil and a second tether of the plurality of tethers comprising a second conductive trace for providing heat sensor current to the heat sensor.

15. The acoustic resonator device of claim 14, further comprising:
an inner heater coil and an inner heat sensor disposed along an inner perimeter of the acoustic resonator;
a third conductive trace for providing inner heater current to the inner heater coil; and
a fourth conductive trace for providing inner heat sensor current to the inner heat sensor.

16. The acoustic resonator device of claim 15, wherein each of the third conductive trace and the fourth conductive trace wrap around the pillar formed in the trench.

17. The acoustic resonator device of claim 13, further comprising:
a reference resistor having a predetermined reference resistance, wherein the heat sensor is configured to compare the predetermined reference resistance and a sensor resistance of the heat sensor, wherein the sensor resistance varies according to the temperature of one of the heater coil and the piezoelectric layer of the acoustic resonator.

18. The acoustic resonator device of claim 17, wherein the heat sensor is further configured to provide a sensed voltage based on a difference between the predetermined reference resistance and the sensor resistance, and to convert the sensed voltage to a bias current for adjusting the heater current.

* * * * *